United States Patent [19]
Koike et al.

[11] 4,323,912
[45] Apr. 6, 1982

[54] SOLID-STATE IMAGING DEVICE

[75] Inventors: Norio Koike; Toshihisa Tsukada, both of Tokyo; Haruhisa Ando; Hideaki Yamamoto, both of Hachioji; Tadaaki Hirai, Koganei; Masaharu Kubo, Hachioji; Eiichi Maruyama, Kodaira; Toru Baji, Kikubunji; Yukio Takasaki; Shusaku Nagahara, both of Hachioji, all of Japan

[73] Assignee: Hitachi, Ltd., Tokyo, Japan

[21] Appl. No.: 152,690

[22] Filed: May 23, 1980

[30] Foreign Application Priority Data

Jun. 4, 1979 [JP] Japan ................................ 54-68970

[51] Int. Cl.³ .................................. H01L 27/14
[52] U.S. Cl. ........................ 357/31; 357/30; 357/23; 357/24
[58] Field of Search ................ 397/31, 30, 16, 23, 397/24

[56] References Cited

U.S. PATENT DOCUMENTS

| 4,007,473 | 2/1977 | Nonaka | 357/31 |
| 4,143,389 | 3/1979 | Koike | 357/31 |
| 4,148,051 | 4/1979 | Koike | 357/30 |
| 4,223,330 | 9/1980 | Koike | 357/32 |
| 4,236,829 | 12/1980 | Chikomura | 357/16 |
| 4,268,845 | 5/1981 | Koike | 357/30 |

Primary Examiner—Martin H. Edlow
Attorney, Agent, or Firm—Craig and Antonelli

[57] ABSTRACT

In a solid-state imaging device having a semiconductor integrated circuit in which a plurality of switching elements for addressing positions of picture elements and scanning circuitry for turning the switching elements "on" and "off" in time sequence are disposed on an identical substrate, a photoconductive film which is disposed on the integrated circuit and which is connected with the respective switching elements, and a light transmitting electrode which is disposed on the photoconductive film, a voltage being applied to the light transmitting electrode thereby to bias a region of the photoconductive film on a light entrance side either positively or negatively with respect to a region thereof on the opposite side; a solid-state imaging device characterized in that said each switching element is an element which uses carriers of a polarity opposite to that of carriers having a greater mobility in said photoconductive film.

5 Claims, 5 Drawing Figures

SOLID-STATE IMAGING DEVICE

BACKGROUND OF THE INVENTION

(1) Field of the Invention

This invention relates to a solid-state image pickup device for use in a television camera etc. Particularly, it relates to a solid-state imaging device which has a photoelectric conversion layer, a plurality of switching elements and horizontal and vertical scanning circuits, all these constituents being provided in a major surface portion of a semiconductor body.

More specifically, it relates to a solid-state device which has a photoconductor and switching elements addressed by scanning circuits for reading out from the photoconductor optical information stored therein.

(2) Description of the Prior Art

Solid-state imaging devices are classified into two types; the type wherein optical signals are stored in photodiodes or MOS (Metal-Oxide-Semiconductor) capacitances formed on a semiconductor substrate, and the type wherein only scanning circuits (scanners) and groups of switches connected thereto are arrayed on a semiconductor substrate and they are overlaid with a photoconductive film for the function of photoelectric conversion. The former is such that scanning circuits, groups of switches for addressing and the photoelectric conversion elements are integrated, in general, on an identical plane and that the source junctions, for example, of insulated-gate field effect transistors (hereinbelow, termed "MOSTs") serving as the switches can be utilized also for photoelectric conversion elements, so it can be fabricated comparatively easily. It is therefore a solid-state imaging device which has been performed for long. Since, however, the elements taking charge of the various functions exist on the identical plane, the integration density is low. This is a problem which may be said fatal for the imaging devices requiring 500×500 or more picture elements, and has hindered enhancements in the resolution and photosensitivity of the solid-state imaging device. In contrast, the latter which has been devised relatively recently in order to solve the problem of the former is such that the integration density of picture elements (that is, the resolution) and the efficiency of receiving light become higher owing to the double-layer structure in which photoelectric conversion elements are formed on the scanning circuits and the groups of switches. It is therefore expected as the future solid-state imaging device. An example of the solid-state imaging device of this type is disclosed in Japanese Patent Application Laid-open Specification No. 51-10715 (filed July 5, 1974). FIGS. 1A and 1B show the construction and structure of the device for explaining the principle thereof, respectively. In FIG. 1A, numeral 1 designates a horizontal scanner for turning "on" and "off" horizontal switching elements 3, numeral 2 a vertical scanner for turning "on" and "off" vertical switching elements 4, numeral 5 a photoelectric conversion part utilizing a photoconductive film, numeral 6 a power supply input terminal for driving the photoelectric conversion parts 5, numeral 10 a signal output line, and letter R a resistor. FIG. 1B shows the sectional structure of the photoelectric conversion part and the switching elements in FIG. 1A. Symbol 5' indicates the photoconductive film, symbol 6' the power supply input terminal disposed through a transparent electrode 7, symbol 3' the horizontal switching MOST, symbol 4' the vertical switching MOST, and numeral 8 an insulating film. Numeral 11 denotes a semiconductor substrate, numerals 121 and 122 gate electrodes, and numeral 13 an electrode (of, for example, Al) which is held in ohmic contact with one end 91 of the switching MOST 4'. When the optical image of an object is focused on the photoconductive film through a lens, the resistance of the photoconductive film varies in accordance with the light intensity of the optical image, a signal voltage corresponding to the optical image appears at the one end 91 of the vertical switching MOST 4 (4'), and the variation is derived from an output terminal OUT through the signal output line 10 as a video signal.

The inventors fabricated the aforecited solid-state imaging device by the use of the P-channel MOS device fabricating technique which is the stablest in the MOS-IC technology, and evaluated its characteristics. More specifically, scanning circuits and groups of switches were constructed of P-channel MOSTs whose sources and drains were formed by diffusing P-type impurities into a Si substrate of the N-type conductivity, a Se-As-Te evaporation film which is used as the photoconductive film of an image pickup tube was disposed on the group of switches, and a transparent electrode was formed on the evaporated film (refer to U.S. Pat. Nos. 3,890,525 and 4,040,985). The Se-As-Te film has a component distribution in the direction perpendicular to the plane of the film, and contains Se 50% or more as its component ratio within the film. The Se-As-Te amorphous film can be evaporated at the normal temperature, and is desirable for the solid-state imaging device requiring a long lifetime because the film after the fabrication is stabler than the other photoconductive films even in the air. In this film (Se-As-Te amorphous film), however, the mobility of holes is greater than that of electrons, predominant conduction charges become the holes, and the main constituents of current are the holes. Therefore, the holes generated in the upper surface of the photoconductive film are mostly attracted to the transparent electrode 7 to which a minus voltage is applied, whereas the electrons scarcely reach the switch side electrode 13. As a result, the voltage variation on which the video signal is based does not arise in the switch side electrode 13, in other words, the photosensitivity is conspicuously low (since the P-channel MOST is operated by the minus voltage, the voltage variation owing to the storage of the electrons needs to appear in the switch side electrode). The sensitivity is the most important factor that determines the quality of the imaging device, and is a problem which must be solved by all means in order to realize household cameras being the main use of the solid-state imaging devices.

SUMMARY OF THE INVENTION

This invention makes improvements in the prior-art solid-state imaging device described above.

That is, the object of this invention is to provide a solid-state imaging device which has an improved photosensitivity, i.e., a high photoelectric conversion efficiency.

According to this invention, in order to accomplish the object, in case where the predominant conduction charges of a photoconductive film to be formed on a scanning IC substrate in which scanning circuits and groups of switches are integrated are holes (P-type), the scanning IC substrate constructed of N-channel MOSTs is combined, whereas in case where the predominant conduction charges are electrons (N-type), the scanning IC substrate constructed of P-channel MOSTs is combined.

DESCRIPTION OF THE PREFERRED EMBODIMENTS

Hereunder, this invention will be described in detail with reference to embodiments thereof.

Embodiment 1

Figure 1A:
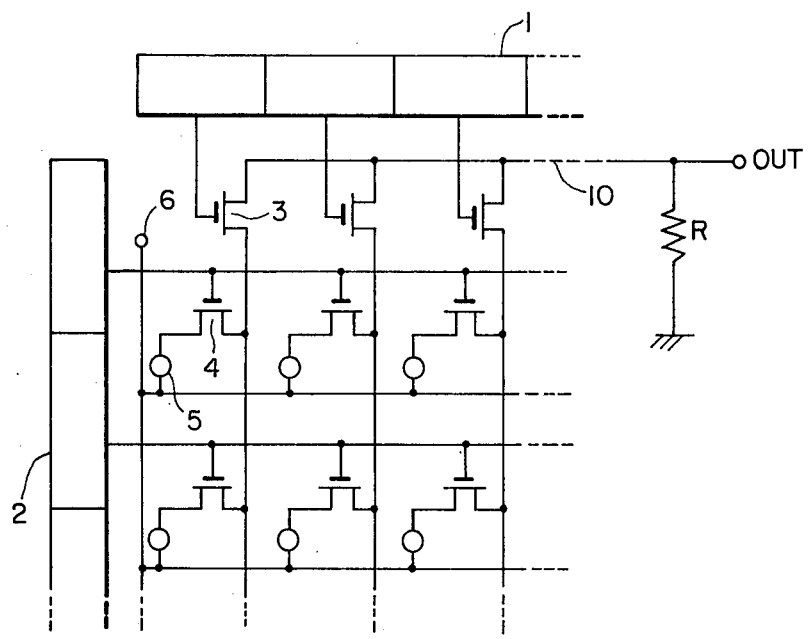
FIG. 1A is a schematic circuit diagram showing the outline of a solid-state imaging device which employs a photoconductive film as a photoelectric conversion part.
Figure 1B:
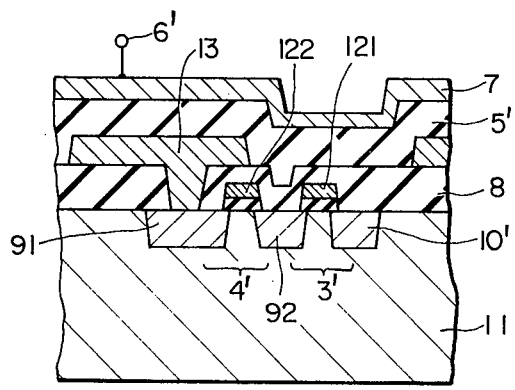
FIG. 1B is a partial sectional view showing the structure of the solid-state imaging device which employs the photoconductive film as the photoelectric conversion part.
Figure 2:
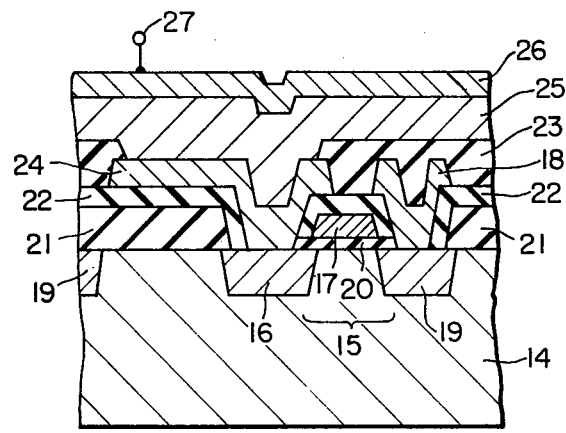
FIG. 2 is a partial sectional view showing the structure of an embodiment of a solid-state imaging device of this invention which employs as a photoelectric conversion part a photoconductive film whose predominant conduction charges are holes.
Figure 3:
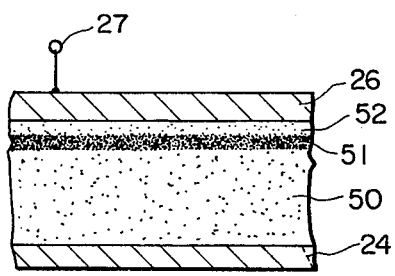
FIG. 3 is a partial sectional view showing the structure of a Se-As-Te photoconductive film.

Case where the predominant conduction charges of a photoconductive film are holes (P-type):

As photoconductive films, ones of various types have hitherto been developed for use in image pickup tubes. In the electron tubes, the scanning is effected with electron beams or electrons, so that predominant conduction charges are holes in many cases. The structure of a solid-state imaging device in the case of using a photoconductive film of such type is illustrated in FIG. 2. This figure represents a picture element which constructs the photoelectric conversion portion of the imaging device. In actuality, a plurality of such picture elements are arrayed in two dimensions to construct the device shown in FIG. 1A. Numeral 14 designates a semiconductor (for example, Si) substrate of the P-type conductivity. Numeral 15 designates a vertical switching MOST which consists of an impurity region of the N-type conductivity 16, a gate electrode 17, and an impurity region of the N-type conductivity 19 that is connected to a signal output line (of Al or the like) 18 biased with a positive voltage or grounded. Numeral 20 indicates a gate insulating film (of $SiO_2$ or the like), numeral 21 an insulating film for isolating picture elements (of $SiO_2$ or the like), and numerals 22 and 23 insulating films for isolating interconnections (of $SiO_2$ or the like). Numeral 24 denotes an electrode (in general, Al, Mo, polycrystalline Si or the like is used) which is connected to the one terminal 16 of the switching MOST 15, numeral 25 a photoconductive film the predominant conduction charges of which are holes, and numeral 26 a transparent or semitransparent electrode (of $SnO_2$, $InO_2$, polycrystalline Si, a thin layer of Au (100 Å) or the like) and to which a plus voltage (when the signal line 18 is biased with the positive voltage, a higher positive voltage is used) from a power supply input terminal 27. As typical examples of the photoconductive film to be used here, there are the Se-As-Te film referred to previously, a binary composition film containing Zn-Se and Zn-Cd-Te, and a polycrystalline silicon film frequently employed in MOS-ICs. FIG. 3 shows the structure of the Se-As-Te film. A Se-As-based film 50 and subsequently a Se-As-Te-based film 51 as well as a Se-As-based film 52 are continuously formed by the vacuum evaporation.

Figure 4:
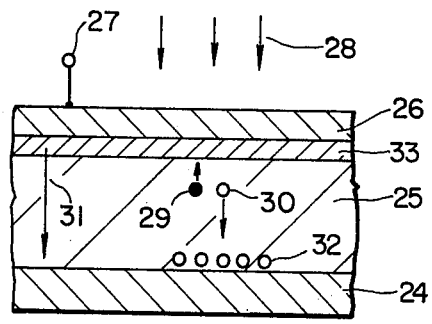
FIG. 4 is a schematic sectional view of a photoconductive film part for explaining the operation of the solid-state imaging device of this invention.

FIG. 4 is a view for explaining the operation of the imaging device, in which the photoconductive film and the vicinity thereof in FIGS. 2 and 3 are extracted. When light 28 has entered the photoconductive film 25, excited charges or electrons 29 and holes 30 appear in various positions within the film. Herein, the predominant conduction charges are the holes of greater mobility, and the holes travel towards the electrode 24 efficiently (without disappearing midway due to recombination etc.) owing to an electric field 31 established between the transparent electrode 26 and the underlying electrode 24 and are stored on the electrode 24 (as indicated at 32). By the next addressing, the holes having been stored over one frame period are read out as a signal through the switching MOST 15 and a horizontal switching MOST and become a video signal. At the same time, the holes on the electrode 24 disappear, so that the electrode 24 is cleared from a plus voltage to, for example, zero V to make preparations for the entrance of the optical image of the next frame. Short-wavelength light of high absorption efficiency (blue light) is mostly absorbed by an upper region 33 of the photoconductive film, but the holes generated in this region travel efficiently and are stored on the electrode 24. Therefore, the uncertainty of the blue sensitivity which is a problem in conventional silicon solid-state imaging devices can be remarkably improved. Of course, the sensitivities to green and red are high, and the sensitivity to the whole light or white light can be greatly improved. Accordingly, the above solid-state imaging device becomes an image pickup device which is favorable both for the color image pickup and for the black-and-white image pickup.

As an example, the solid-state imaging device in FIG. 2 was manufactured in accordance with a prior-art MOSIC processing step (Japanese patent application Laid-open Specification No. 53-122316) and a prior-art evaporation processing step for pickup tubes (Japanese Patent Application Publication Specification No. 52-30091, Japanese Patent Application Laid-open Specification No. 51-120611) in such a way that switching MOSTs 15 each consisting of N-type source and drain regions 16 and 19 at an impurity concentration of $10^{19}$–$10^{21}$/cm$^3$ and an N-type polycrystalline Si (impurity concentration $10^{19}$ ~ $10^{21}$/cm$^3$) gate electrode were disposed on a P-type Si substrate 14 at an impurity concentration of 4–8×$10^{14}$/cm$^3$, that Al layers being 5000 Å–1 μm thick were used as an electrode 24 and a signal line 18, that a Se-As-Te amorphous evaporation film being 5000 Å–5 μm thick was used as a photoconductive film 25, and that a $SnO_2$ layer being 1000 Å–2 μm thick was used as an electrode 26. Then, a good device could be obtained.

Embodiment 2

Figure 5:
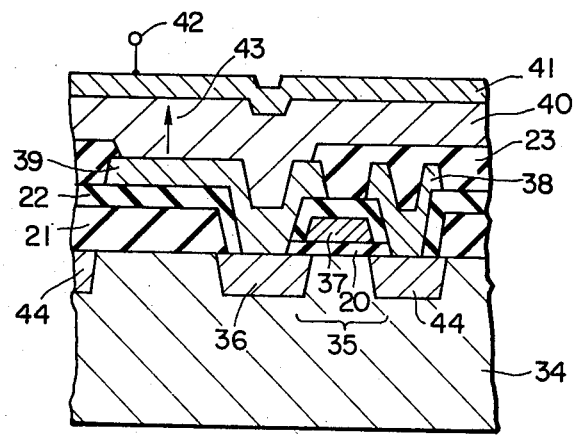
FIG. 5 is a partial sectional view showing the structure of another embodiment of the solid-state imaging device of this invention which employs as a photoelectric conversion part a photoconductive film whose predominant conduction charges are electrons.

Case where the predominant conduction charges of a photoconductive film are electrons (N-type):

Since the photoconductive films hitherto developed have taken the electron beam scanning into account as described before, many of their materials have been of the type in which the predominant conduction charges are holes. An embodiment of this invention shown in FIG. 5, however, permits the use of materials whose conduction is dominated by electrons and which have hitherto been discovered but have not often been used in practice. Referring to the figure, numeral 34 designates an N-type semiconductor substrate. Numeral 35 designates a vertical switching MOST consisting of a P-type impurity region 36, a gate electrode 37, and a p-type impurity region 44 which is connected to a signal output line 38 that is biased to a negative voltage or grounded. Numeral 39 indicates an electrode which is connected to the one end 36 of the switching MOST 35, numeral 40 a photoconductive film the predominant conduction charges of which are electrons (for example, amorphous Si (a-Si:H) having a hydrogen content of 15-20% in terms of the atomic %), and numeral 41 a transparent electrode to which a minus voltage (when the signal line 38 is biased to the negative voltage, a lower negative voltage is used) is applied from a terminal 42. Accordingly, when light has entered the photoconductive film 40, electrons travel towards the electrode 39 efficiently owing to an electric field 43 established between the transparent electrode 41 and the underlying electrode 39 and are stored on the electrode 39. By the next addressing, the electrons having been stored over one frame period are read out as a signal through the switching MOST 35 and a horizontal switching MOST and become a video signal. The electrons on the electrode 39 are simultaneously extinguished, so that the electrode is cleared from a minus voltage to, for example, zero V to make preparations for the entrance of the optical image of the next frame.

Although, in the foregoing embodiments 1 and 2, the insulated-gate field effect transistors have been exemplified as the switching elements, it is a matter of course that a solid-state imaging device can be similarly fabricated even with charge transfer devices (CTDs) such as charged coupled devices (CCDs).

As set forth above, this invention has the great advantage that, not only the enhancement of the sensitivity of the imaging device is realized, but also the use of materials in which the conduction is dominated by electrons and which have not heretofore been employed in practice is permitted. The industrial value of the invention is very great.

What is claimed is:

1. In a solid-state imaging device having a semiconductor integrated circuit in which a plurality of switching elements for addressing positions of picture elements and scanning circuitry for turning the switching elements "on" and "off" in time sequence are disposed on an identical substrate, a photoconductive film which is disposed on the integrated circuit and which is connected with the respective switching elements, and a light transmitting electrode which is disposed on the photoconductive film, a voltage being applied to the light transmitting electrode thereby to bias a region of the photoconductive film on a light entrance side either positively or negatively with respect to a region thereof on the opposite side; a solid-state imaging device characterized in that said each switching element is an element which uses carriers of a polarity opposite to that of carriers having a greater mobility in said photoconductive film.

2. A solid-state imaging device as defined in claim 1, wherein the light entrance side region of said photoconductive film is biased positively with respect to the opposite side region thereof, and said each switching element is an N-channel element whose carriers are electrons.

3. A solid-state imaging device as defined in claim 1, wherein the light entrance side region of said photoconductive film is biased negatively with respect to the opposite side region thereof, and said each switching element is a P-channel element whose carriers are holes.

4. A solid-state imaging device as defined in claim 1, 2 or 3, wherein said each switching element is either of an insulated-gate field effect transistor and a charge transfer device (CTD).

5. A solid-state imaging device as defined in claim 1, wherein said photoconductive film is a Se-As-Te amorphous film, the light entrance side region of said photoconductive film is biased positively with respect to the opposite side region thereof, and said each switching element is an N-channel field effect transistor.

* * * * *